US012284842B2

(12) United States Patent
Sciuto et al.

(10) Patent No.: US 12,284,842 B2
(45) Date of Patent: Apr. 22, 2025

(54) SOLAR CELL AND SOLAR CELLS MODULE

(71) Applicant: 3SUN S.R.L., Catania (IT)

(72) Inventors: Marcello Sciuto, Rome (IT); Andrea Canino, Rome (IT); Giuseppe Condorelli, Rome (IT); Cosimo Gerardi, Rome (IT); Antonio Terrasi, Rome (IT); Giacomo Torrisi, Rome (IT); Anna Battaglia, Rome (IT)

(73) Assignee: 3SUN S.R.L., Catania (IT)

( * ) Notice: Subject to any disclaimer, the term of this patent is extended or adjusted under 35 U.S.C. 154(b) by 0 days.

(21) Appl. No.: 17/927,989

(22) PCT Filed: May 27, 2021

(86) PCT No.: PCT/IT2021/050167
§ 371 (c)(1),
(2) Date: Nov. 28, 2022

(87) PCT Pub. No.: WO2021/240569
PCT Pub. Date: Dec. 2, 2021

(65) Prior Publication Data
US 2023/0231062 A1    Jul. 20, 2023

(30) Foreign Application Priority Data

May 27, 2020   (IT) ..................... 102020000012613

(51) Int. Cl.
*H10F 77/20*     (2025.01)
*H10F 10/166*    (2025.01)
*H10F 19/90*     (2025.01)

(52) U.S. Cl.
CPC ......... *H10F 77/254* (2025.01); *H10F 10/166* (2025.01); *H10F 19/906* (2025.01);
(Continued)

(58) Field of Classification Search
CPC ......... H01L 31/022466; H01L 31/0512; H01L 31/022491; H10F 10/166; H10F 77/251; H10F 77/254; H10F 77/244
See application file for complete search history.

(56) References Cited

U.S. PATENT DOCUMENTS 5,667,853 A * 9/1997 Fukuyoshi .......... G02F 1/13439
                                                    428/472
2009/0126791 A1   5/2009 Lu et al.
(Continued)

FOREIGN PATENT DOCUMENTS

CN   108831968 A   11/2018
KR   101919611 B1  11/2018

OTHER PUBLICATIONS

International Search Report and Written Opinion issued on Sep. 2, 2021, in corresponding International Application No. PCT/IT2021/050167, 17 pages.
(Continued)

*Primary Examiner* — Kourtney R S Carlson
(74) *Attorney, Agent, or Firm* — Maier & Maier, PLLC

(57) ABSTRACT

A solar cell including at least a first layer made of a semiconductor material for absorbing photons from light radiation and releasing charge carriers, and at least one conductive layer, overlapping the first layer, adapted to allow the light radiation to enter into the solar cell towards the first layer and to collect the charge carriers released by the first layer, the solar cell where the conductive layer includes at least three overlapped layers, including a transparent intermediate metal layer, made of metal, and two transparent oxide layers, made of a conductive oxide, where the two oxide layers are an inner oxide layer and an outer oxide layer surrounding the transparent intermediate metal layer to provide a low resistance path for the electrical charges and to maximize the amount of light radiation entering the solar cell. The embodiments also include a solar cells module including said solar cell.

7 Claims, 10 Drawing Sheets

(52) U.S. Cl.
CPC ......... *H10F 77/244* (2025.01); *H10F 77/247* (2025.01); *H10F 77/251* (2025.01)

(56) References Cited

U.S. PATENT DOCUMENTS

2018/0138343 A1\* 5/2018 Lee ................... H01L 31/0508
2019/0067509 A1\* 2/2019 Lennon ............... H01L 31/1884

OTHER PUBLICATIONS

Lee et al., "The optical analyses of the multilayer transparent electrode and the formation of ITO/Mesh-Ag/ITO multilayers for enhancing an optical transmittance", Applied Surface Science, Sep. 1, 2019, vol. 487, 10 pages.

Ferhati et al., "Performance assessment of TCO/metal/TCO multilayer transparent electrodes: from design concept to optimization", Journal of Computational Electronics, Springer US, Feb. 11, 2020, Boston, vol. 19, No. 2, 10 pages.

Lin et al., "Effects of the structural properties of metal oxide/Ag/metal oxide multilayer transparent electrodes on their optoelectronic performances", Journal of Materials Science: Materials in Electronics, Chapman and Hall, May 5, 2017, London, vol. 28, No. 16, 9 pages.

Mishima et al., "Development status of high-efficiency HIT solar cells", Solar Energy Materials and Solar Cells, Elsevier Science Publishers, Jan. 1, 2011, Amsterdam, vol. 95, No. 1, 4 pages.

Italian Search Report issued on Feb. 16, 2021, in corresponding Italian Application No. 102020000012613, 9 pages.

\* cited by examiner (Prior art)

SOLAR CELL AND SOLAR CELLS MODULE

FIELD

The present invention concerns a novel solar cell and a solar cells module.

Specifically, the present invention concerns a solar cell, in particular a heterojunction (HJT) solar cell, with a novel conductive layer. An example of such HJT solar cell is a HJT solar cell having a hydrogenated intrinsic amorphous silicon layer (a-Si:H) as passivation layer deposited over a crystalline silicon (c-Si) wafer surface. However, said novel conductive layer may be applied also to other solar cells.

BACKGROUND

It is well known that the manufacturing of high efficient a-Si:H/c-Si HJT requires optimizing chemical and physical processes, often with subsequent high costs related to the use of some consumable elements, such as silver paste and thin transparent conductive oxide (TCO).

HJT solar cells, in fact, are typically realized by depositing a very thin (10 nm-20 nm) hydrogenated amorphous silicon layer (a-Si:H layer) as passivation layer over a mono-crystalline silicon (Si) bulk substrate, also referred as Si wafer. The Si bulk substrate typically employed has a resistivity between 0.1 Ωcm and 10 Ωcm and a thickness between 100 μm and 250 μm. In case of HJT bifacial solar cells, the passivation layer is deposited on both sides of a mono-crystalline Si wafer, also indicated with the reference c-Si wafer.

Before the deposition of a-Si:H, the Si bulk substrate may undergo a texturization process, consisting of several different chemical etching steps.

a-Si:H layers, or eventually any other passivation layer such the ones made of silicon sub-oxide or silicon carbide or eventually any other material suitable for this scope, are usually deposited on both sides of the c-Si wafers to passivate the c-Si surface by a reduction of its silicon dangling bonds.

Therefore, since the initial etching may reduce surface defects, this step allows reducing the localized level defects inside the band-gap at the interface, which are recombination centers for minority carriers, and which can cause a reduction of the open circuit voltage ($V_{OC}$).

After passivation, contacts layers can be deposited over the passivated surfaces, such contact layers being made with a p-doped hydrogenated amorphous silicon layer (p-a-Si:H), or p+ layer, used to create the PN junction on one side of the solar cell, and a n-doped hydrogenated amorphous silicon layer (n-a-Si:H), or n+ layer, on the opposite side of the cell.

When the crystalline silicon wafer is a n-type crystalline silicon wafer (n-type c-Si), the p-side of the cell, i.e. the side of the cell having the p+ layer, is the emitter.

Furthermore, when n-type crystalline silicon wafers are employed, the minority carriers of said n-type c-Si are holes, and it is possible to achieve high efficiencies.

The cell is finally covered with the layer made of TCO, deposited on both sides of the wafer, that is a conductive oxide for collecting electrical charges.

The TCO for manufacturing HJT cells is typically indium trioxide $In_2O_3$ doped with stannic oxide $SnO_2$ (also known as ITO) and the ratio in weight between $In_2O_3$ and $SnO_2$ can vary from 90% $In_2O_3$ 10% $SnO_2$, to 97% $In_2O_3$ 3% $SnO_2$, which means that the TCO can be highly doped. Alternative to the ITO, there are TCOs made of aluminum-doped zinc oxide AlZnO, also known as AZO. The main drawback of AZO is a much lower conductivity with respect to ITO, but it has the important advantage of avoiding the use of an expensive and toxic element such as Indium.

In all cases, the TCO is usually a n-type doped semiconductor, which electronically behaves as a metal with limited transport properties, if compared to a real one.

Therefore, the charge carrier mobility and the electronic behavior of the junction between TCO and the hydrogenated amorphous silicon layer TCO/a-Si:H, is usually assumed to be similar to a metal-semiconductor junction.

Furthermore, the TCO work function may contribute in a significant way to the band alignment in the cell structure (TCO/a-Si:H/c-Si), conditioning the charge carrier transport across the heterojunctions.

In summary, the role of TCO is to collect charges coming from the silicon contact and to transfer them with minimum losses to a metal grid, which will be described below.

Ideally, the TCO should have the following properties:
low resistivity;
high carrier mobility;
high carrier concentration;
high optical transparency.

However, achieving all these properties together is not trivial, and some compromises are usually accepted.

In fact, an increased carrier mobility can be obtained by decreasing the carrier concentration which, in turn, increases the resistivity of the TCO.

On the other hand, increasing the carrier concentration decreases at the same time the carrier mobility and the optical transmittance (i.e. the transparency) of the TCO and, as a consequence of the cell.

As already mentioned, a metallization grid is usually deposited over the layers of TCO.

In particular, such metallization grid, has the function of collecting the electric charges from the TCO in an efficient way.

The metallization grid is usually made of silver electrodes, which can be realized through different manufacturing processes.

One preferred process for producing a metallization grid on a HJT solar cell is through screen printing (SP) of a silver paste, namely a paste containing silver particles.

Another known process for producing a metallization grid is based on the metal electrochemical plating over the surfaces of the cell.

The metallization grid layout usually comprises thin long parallel contacts running along the cell called fingers and larger contacts, crossing the fingers, called bus bars.

Inside a photovoltaic solar module, cells are connected in series through metallic ribbons that are attached to the bus bars, usually by soldering or by gluing.

The architecture of a typical HJT bifacial solar cell is shown in FIG. 1.

As already mentioned, the use of silver pastes for manufacturing the metallization grid of HJT solar cells is expensive.

Furthermore, silver pastes should be cured at low temperatures and require to be carefully formulated in order to ensure good resistance between contacts and also good fingers resistivity.

SUMMARY

Therefore, purpose of the present invention is to provide a solar cell with alternative charge collectors.

Furthermore, purpose of the present invention is to maximize the total incident light radiation on the solar cell.

A further purpose of the present invention is that such alternative to charge collectors should be less expensive than the metallization grids commonly used, both in terms of costs related to the materials used and in costs related to the manufacturing process.

Consequently, purpose of the present invention is to minimize or to eliminate silver paste consumption in processes used for manufacturing solar cells.

Finally, another purpose of the present invention is to provide a solar cell module with a simplified interconnection scheme between solar cells.

Such purposes have been achieved by replacing the metallization layer with a layer made of TCO having improved electrical properties.

In particular, the typical cell layout has been modified replacing the metallization grid with a multilayer TCO-Metal-TCO (also referred as Oxide-Metal-Oxide or OMO) with improved electrical properties and by using a new interconnection scheme at module level, which reduces the bill of materials of the module itself, if compared with known solar cells modules.

It is therefore a specific object of the present invention a solar cell comprising at least a first layer made of a semiconductor material for absorbing photons from light radiation and releasing charge carriers, and at least one conductive layer, overlapping said first layer, adapted to allow said light radiation to enter into said solar cell towards said first layer and to collect the charge carriers released by said first layer. Specifically, said conductive layer comprises at least three overlapped layers, which are:

a transparent intermediate metal layer, made of metal, and
two oxide layers, made of a transparent conductive oxide.

Said two oxide layers are respectively an inner oxide layer and an outer oxide layer surrounding said transparent intermediate metal layer so as to provide a low resistance path for the electrical charges and to maximize the amount of light radiation entering the solar cell.

Said transparent intermediate metal layer has a thickness between 5 nm and 10 nm.

Furthermore, said inner oxide layer has a thickness substantially of 50 nm. In particular, the term "substantially" for thicknesses greater than or equal to 50 nm indicates a possible variability between ±5 nm. In other words, the inner oxide layer has a thickness between 45 nm and 55 nm, preferably equal to 50 nm.

Finally, said outer oxide layer has a thickness between 50 nm and 60 nm.

In particular, according to the invention, said transparent intermediate metal layer can have a thickness between 5 nm and 7 nm, said inner oxide layer can have a thickness substantially of 50 nm and said outer oxide layer can have a thickness between 50 nm and 60 nm. Preferably, according to the invention, said transparent intermediate metal layer can have a thickness of 5 nm, said inner oxide layer can have a thickness substantially of 50 nm and said outer oxide layer can have a thickness substantially of 50 nm.

Also, according to the invention, at least one of said oxide layers can be made of indium trioxide $In_2O_3$ doped with stannic oxide $SnO_2$ or can be made of aluminum doped zinc oxide.

In addition, according to the invention, said transparent intermediate metal layer can have the shape of a continuous layer.

Furthermore, according to the invention, said transparent intermediate metal layer can be arranged as a mesh network.

According to the invention, said solar cell can be a heterojunction bifacial solar cell comprising a front side and a rear side, wherein said at least one first layer can comprise a first layer made of crystalline silicon, preferably n-type crystalline silicon, a second layer and a third layer. In particular, said second and third layers can be made of hydrogenated amorphous silicon, and can be arranged so as to overlap said first layer, surrounding it. In fact, said second layer can be arranged in correspondence of said front side and said third layer can be arranged in correspondence of said rear side. Furthermore, said solar cell can comprise a fourth layer made of n-type doped hydrogenated amorphous silicon, overlapping said second layer. Said solar cell can also comprise a fifth layer, made of p-type doped hydrogenated amorphous silicon, overlapping said third layer. Finally, said solar cell can comprise two conductive layers of said at least one conductive layer, respectively overlapping said fourth layer and said fifth layer.

According to the invention, said solar cell may not comprise a metallization grid or in it may comprise a metallization grid made only by parallel or substantially parallel conductors.

It is a further object of the present invention a solar cells module characterised in that it comprises a first solar cell and a second solar cell according to the present invention, and connectors for electrically connecting a conductive layer of said first solar cell to a conductive layer of said second solar cell, wherein said connectors are directly attached to said outer oxide layer of said conductive layer of said first solar cell and to said outer oxide layer of said conductive layer of said second solar cell; or to said parallel or substantially parallel conductors on said conductive layer of said first solar cell and/or on said conductive layer of said second solar cell.

BRIEF DESCRIPTION OF THE DRAWINGS

The present invention will now be described, for illustrative but not limitative purposes, according to its preferred embodiment, with particular reference to the figures of the accompanying drawings, wherein.

DETAILED DESCRIPTION OF THE EMBODIMENTS

With reference to FIGS. 2, 3B, 4B, and 4C, a solar cell 1 according to the present invention has a conductive layer 2 on a front side 11 and, preferably also on a rear side 10.

Figure 1:
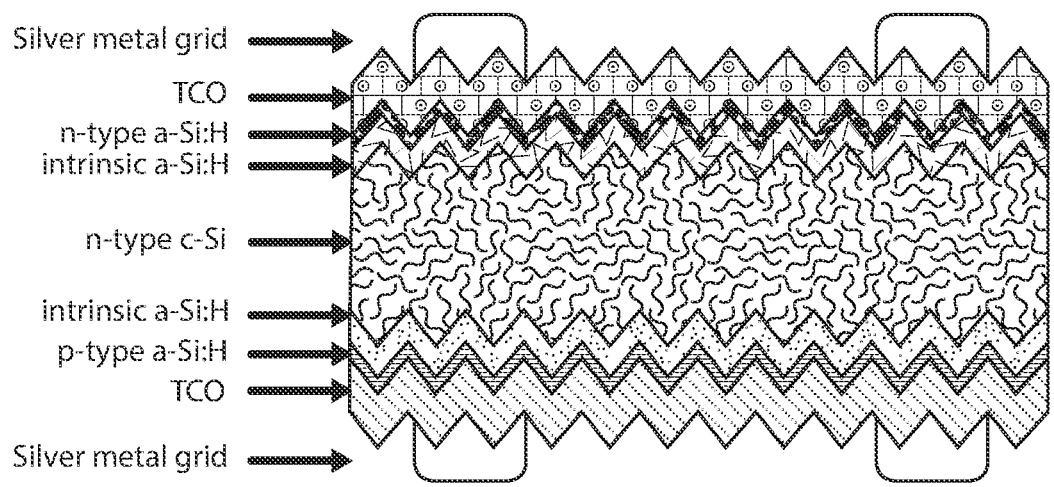
FIG. 1 shows a sectional view of a multilayer structure of a known HJT cell in a back-emitter configuration.
Figure 2:
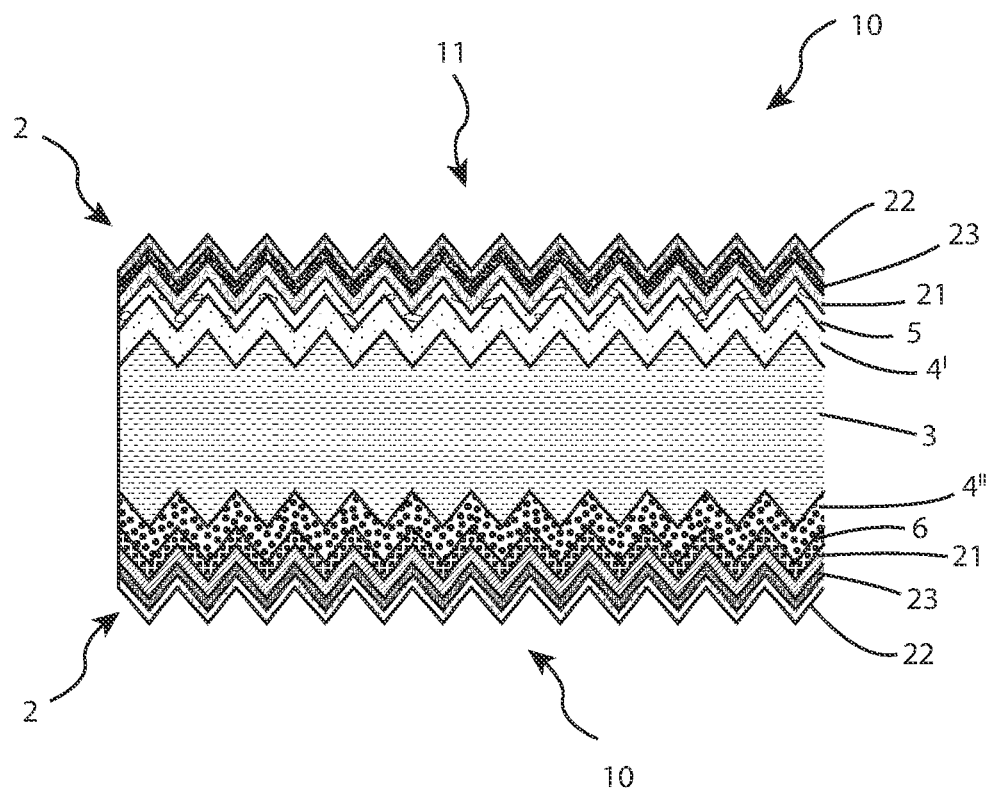
FIG. 2 shows a sectional view of a multilayer structure of a solar cell according to the present invention.
Figure 3A:
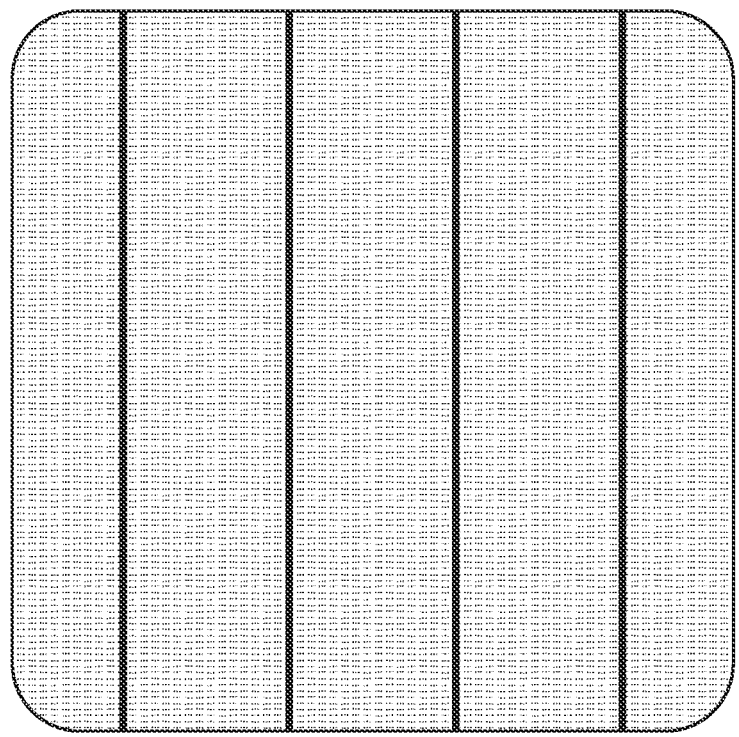
FIG. 3A shows the front view of a known solar cell having a metallization grid.
Figure 3B:
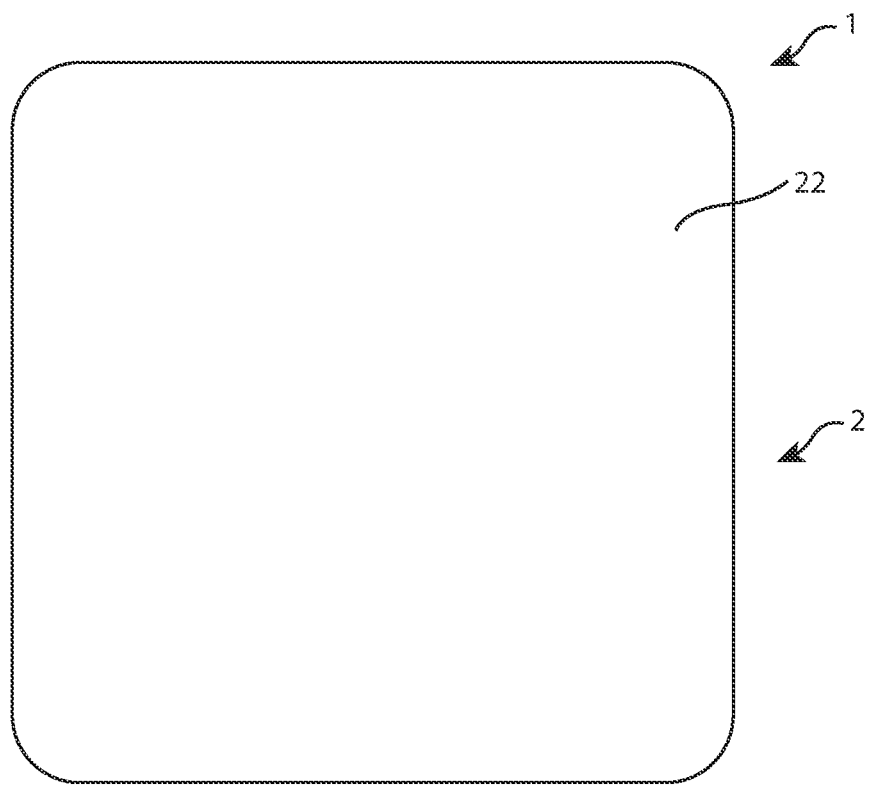
FIG. 3B shows the front view of a solar cell according to the present invention.

Specifically, the solar cell 1 shown in FIG. 2 is a bifacial n-type HJT solar cell 1, however the conductive layer 2 may be applied also on other kind of solar cells, such as p-type wafer base HJT cells or any other kind of solar cells.

Solar cell 1 comprises a central layer 3, or first layer 3, made of c-Si, preferably c-Si(n) and two middle layers 4', 4" made of a-Si:H, surrounding said central layer 3, respectively a second layer 4' arranged in correspondence of the front side 11 of the cell 1 and a third layer 4" arranged in correspondence of the rear side 10 of the cell 1.

Furthermore, solar cell 1 comprises a fourth layer 5 made of a-Si:H(n+), in contact with said second layer 4', and a fifth layer 6 made of a-Si:H(p+), in contact with said third layer 4". Therefore, said fourth layer 5 is arranged in correspondence of the front side 11 of the solar cell 1 and said fifth layer 6 arranged in correspondence of the rear side 10 of the solar cell 1.

All the aforementioned layers made of silicon have the function of absorbing photons from light radiation and releasing charge carriers. In other embodiments, such layers may have a different structure and made with different type of semiconductors.

A conductive layer 2 is deposited over both said fourth and fifth layer 5, 6.

Such conductive layers 2 have the function of allowing the light radiation to enter into said solar cell (1) towards said layer 5, 4', 3 or 6, 4", 3 and to collect the charge carriers released by said layers 5, 4', 3 or 6, 4", 3 into electrical currents.

In particular, each conductive layer 2 comprises two oxide layers 21, 22 made of TCO, which can be ITO or AZO, or other suitable oxides, and a transparent intermediate metal layer 23, placed between said two oxide layers 21, 22.

The transparency of the intermediate metal layer 23 is achieved by minimizing its total thickness, which can be between 5 nm and 20 nm (nanometers), more preferably between 5 nm and 10 nm. Such thickness can be adapted to the required optical and electrical properties of the final device. In an embodiment, the thickness of the intermediate metal layer can be between 5 nm and 7 nm, preferably being equal to 5 nm.

In fact, the transparent intermediate metal layer 23 is mainly responsible of the resistivity of the structure and thickness below 5 nm would not always guarantee the growth of a continuous interconnected metal film.

Furthermore, with such thicknesses, the transparent intermediate metal layer 23 can advantageously achieve values of resistivity in the order of $10^{-6}$ $\Omega$cm, when the film is a continuous film. For example, a resistivity below $10^{-5}$ $\Omega$cm has been measured with an intermediate metal layer 23 made of silver having a thickness about 10 nm.

In addition, such a transparent intermediate metal layer 23 can also be structured, for example being organized in a grid or mesh network or in an ensemble of interconnected nanoparticles. In case of an intermediate metal layer 23 with a mesh network, the presence of apertures in the mesh itself allows a higher transparency of the cell 1, if compared to solar cells 1 having a homogeneous intermediate metal layer 23 with the same thickness. Furthermore, an intermediate metal layer 23 organized in a mesh network allows to achieve very low values of resistivity.

Finally, when the intermediate metal layer 23 is obtained by depositing metal interconnected nanoparticles or nanostructures (e.g. nanoparticles having dimensions between 2-5 nm), a very good electrical conductivity can be achieved, with an increased optical transparency due both to the lower density of the porous film and to a plasmonic effect of the nanostructures.

The transparent intermediate metal layer 23 can be made of silver Ag, copper Cu, gold Au, aluminum Al or other suitable metals.

As already mentioned, the conductive layer 2 can be made by depositing an inner oxide layer 21 over the fourth layer 5 and/or over the fifth layer 6.

Subsequently, after depositing said transparent intermediate metal layer 23 over said inner oxide layer 21, an outer oxide layer 22 can be deposited over said transparent intermediate metal layer 23.

The two oxide layers 21, 22 of each conductive layer 2 can be made with different TCOs.

In particular, the oxides and/or metals used for the conductive layer 2 arranged on the rear side 10 of the solar cell 1 may be different from the ones used on the front side 11 of the same solar cell 1, in order to optimize the electrical and optical properties of the solar cell 1 inside a solar cell module.

The properties of the conductive layer 2 can also be tuned by modifying the layers thicknesses, in order to find the optimal electrical and optical properties of solar cell 1.

The obtained conductive layer 2 can therefore be designed for assuming the combination of electrical and optical properties in such a way that neither pure TCO nor pure metal ultra-thin films can achieve.

In fact, both the pure metal case and the pure TCO case should be excluded, since in both cases the solar cell 1 would not behave in the desired way.

Specifically, the thickness of TCO deposited as inner and outer oxide layers 21 and 22 may vary between 1 nm and 200 nm, preferably between 1 nm and 80 nm.

The combination of the thicknesses of the oxide layers 21 and 22 is a key parameter for controlling the reflectivity of the OMO layer. In fact, being the OMO structure a multi-layered structure, the antireflective effect of this material in the spectral range of the solar light is directly determined by these parameters. Although several thicknesses can be used in the range between 1 nm-200 nm and in particular in the range between 1 nm-80 nm, preferred values have been found between 1 nm and 30 nm or 50 nm for the inner oxide layer 21, and between 30 nm-80 nm for the outer oxide layer 22.

In a preferred embodiment, said inner oxide layer 21 has a thickness substantially of 50 nm and said outer oxide layer 22 has a thickness between 30 nm and 60 nm, more preferably between 50 nm and 60 nm, even more preferably substantially equal to 50 nm.

Hereinafter, the term "substantially" referred to thicknesses greater than or equal to 30 nm will mean a variability of ±5 nm.

Figure 10:
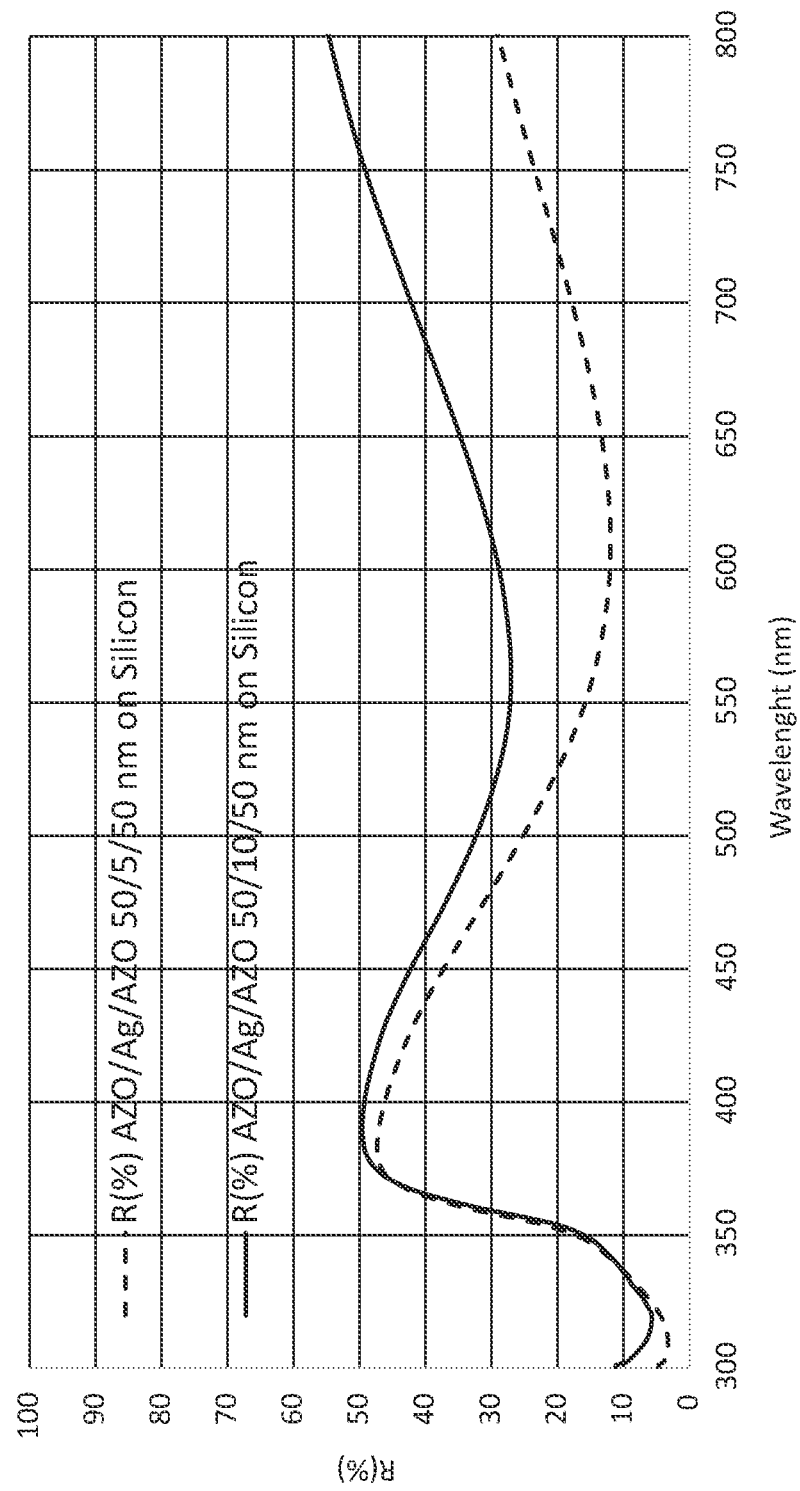
FIG. 10 shows the percentage of the reflectance of a fifth and a sixth example of a solar cell, which is according to the present invention.

Such values ensure the appearance of a significantly extended and broad relative minimum with respect to the reflectance typical behavior defining an optimal reflectance condition for an incident radiation having wavelengths comprised between 500 nm and 700 nm, as shown in FIG. 10 and as better discussed below.

These values have also been selected in order to minimize the thickness of the layers interposed between the layers made of semiconductor 3, 4', 4", 5, 6 and the outer surface of the solar cell 1. At the same time, such thicknesses ensure the maximum protection of solar cell 1 in correspondence of its outer region, which is usually in touch with a final glass protecting, when the solar cell 1 is inside a solar cell module.

Furthermore, the OMO layer 2 selected thicknesses advantageously allow to increase the transparency of the solar cell 1 in the spectral range of the visible light and in the near infra-red.

Specifically, the solar cell 1 has been designed in order to increase the transmission of the red part of the solar spectrum at its rear side 10 of the bifacial solar cell 1, which receives the albedo of the light after reflection on the ground (poor in blue and rich in red wavelength).

Figure 4A:
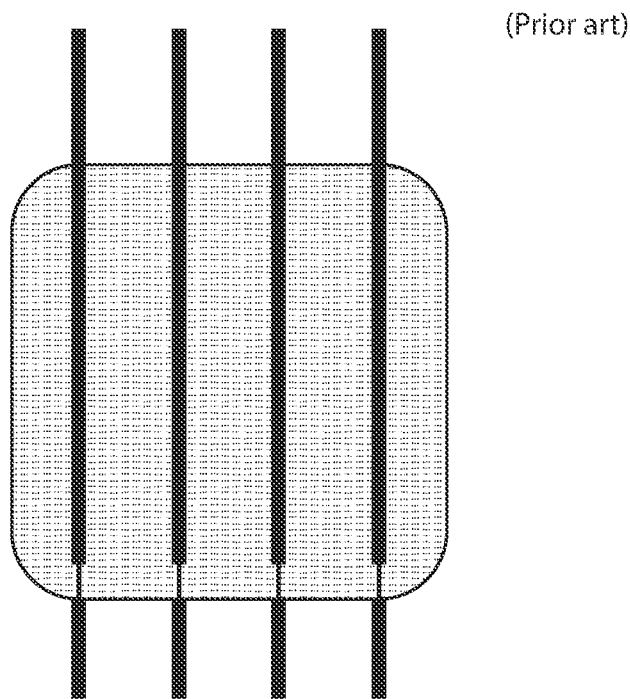
FIG. 4A shows the front view of the solar cell of FIG. 3A inside a first solar cell module.
Figure 4B:
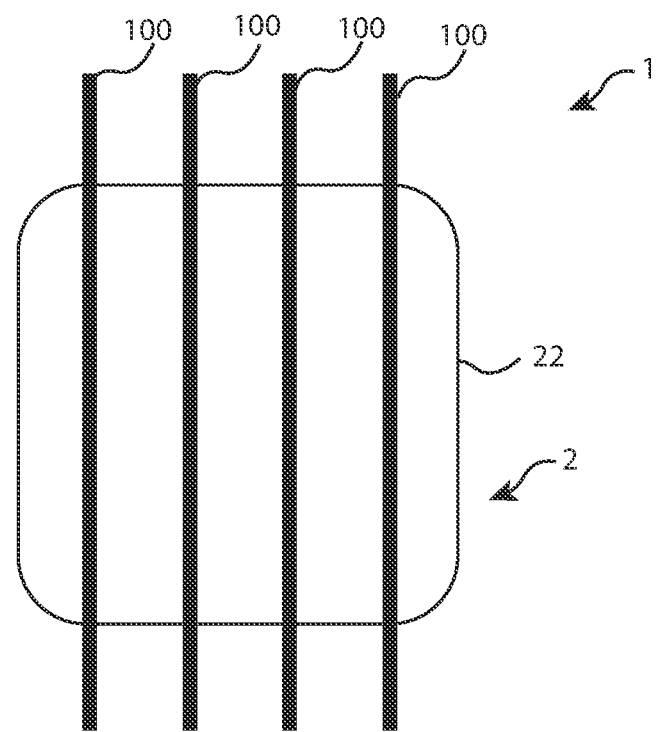
FIG. 4B shows the front view of the solar cell of FIG. 3B inside a second solar cell module.
Figure 4C:
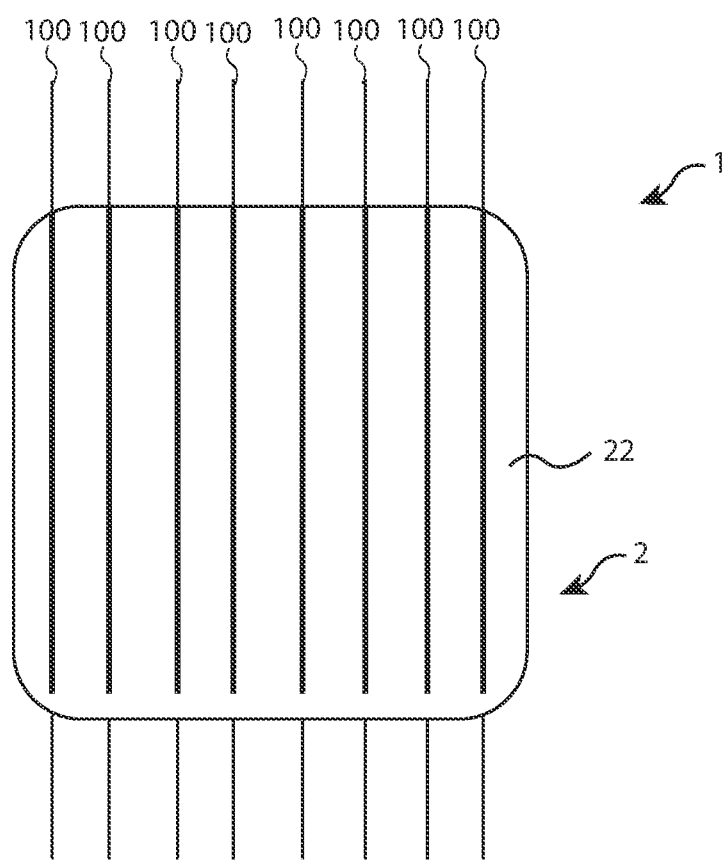
FIG. 4C shows the front view of the solar cell of FIG. 3B inside a third solar cell module.

Furthermore, the outer oxide layer 22 advantageously facilitates the connection a solar cell 1 within a solar cell module, being able to connect by means of interconnection ribbons 100, as shown in FIGS. 4B and 4C.

In fact, since the outermost layer is the outer oxide layer 22 made of TCO, the adhesion between the solar cell 1 and the ribbons 100 is advantageously improved. On the other hand, a direct connection between the transparent intermediate metal layer 23 and the ribbons 100, even if possible, would result in a worse adhesion, due to the possible discontinuities on said transparent intermediate metal layer and to its reduced thickness.

In addition, the configuration of said conductive layer 2 allows to avoid the use of a metal grid on the surface of the solar cell 1. Therefore, such configuration allows to advantageously maximize the amount of light which enters in the solar cell 1, while achieving the required conductibility in order to collect and transport charges up to the ribbons 100, without any further external metallization grid. However, few bus bars may be used to improve the collection of the charge carriers, as explained below.

The particular configuration of said conductive layer 2 results, in fact, in a distributed collection of charges on the whole exterior surface of the cell 1, leading to a better metallization of the solar cell 1 itself.

The combination of these features, allow to advantageously reduce the consumption of silver paste, reducing the costs related to the solar cell 1 manufacturing.

Moreover, also expensive tools, such as screen printers, are not required for producing said solar cell 1, furtherly reducing the costs for manufacturing it.

Furthermore, as mentioned above, the proposed conductive layer 2 allows to attach the ribbons 100 directly on the outer oxide layer 22, without any further intermediate contact.

Specifically, it is advantageously possible to glue said interconnection ribbons 100 directly on said outer oxide layer 22, without any electric loss. In fact, the mechanical strength of the contact between the ribbons 100 and the outer oxide layer 22 is higher than the mechanical strength between ribbons 100 and bus bars made of silver paste.

With reference to FIGS. 4B and 4C, two different metallization approaches can be adopted for connecting said solar cell 1 in a solar cell module.

In particular, a standard approach, as shown in FIG. 4B, uses a classic stringer with four bus bars and four ribbons 100 on top of said bus bars. On the other hand, a more distributed scheme using a multi-wire approach is shown in FIG. 4C, which may be applied on a solar cell 1 according to the present invention.

In both cases there is no need of alignment between ribbons and bus bars, since there is no metal grid on the solar cell 1.

Finally, the conductive layer 2 and the relative interconnection schemes are also advantageously independent from the orientation of the cell, allowing any kind of metallization scheme in a cell module.

In the following paragraphs, some measurements and experiments are described, which allowed to identify an optimal conductive layer 2 for a solar cell 1.

Figure 5:
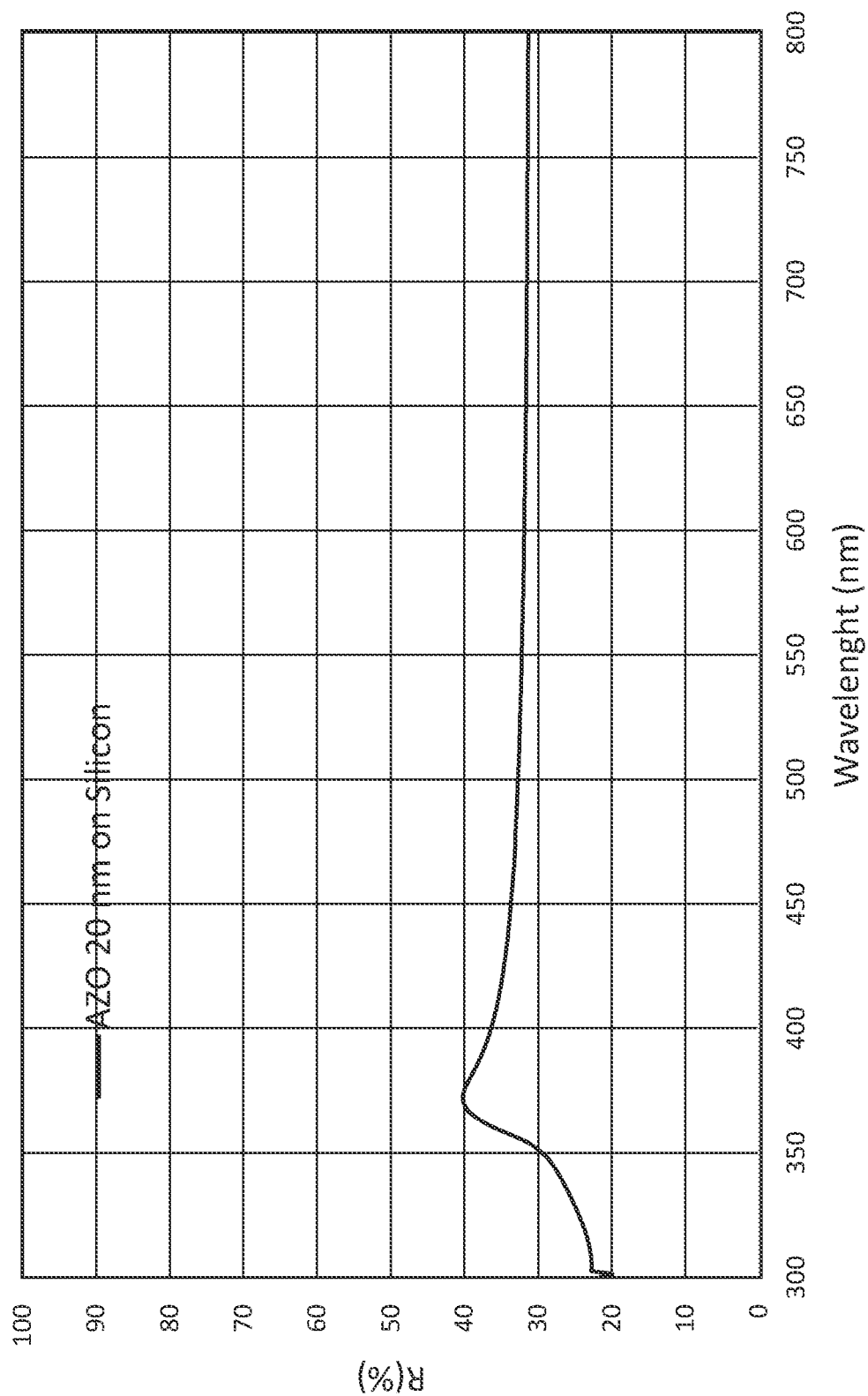
FIG. 5 shows the percentage of the reflectance of a monolithic layer of aluminum-doped zinc oxide having a thickness equal to 20 nm, as a function of an incident radiation wavelength.

In FIG. 5 the percentage of the reflectance of a monolithic AZO layer is shown as a function of an incident radiation wavelength, wherein the monolithic AZO layer has a thickness equal to 20 nm. It is evident that a local maximum in reflectance is achieved for a wavelength of approximately 375 nm, while for greater wavelengths there is a plateau or an increasing monotonic behavior.

Figure 6:
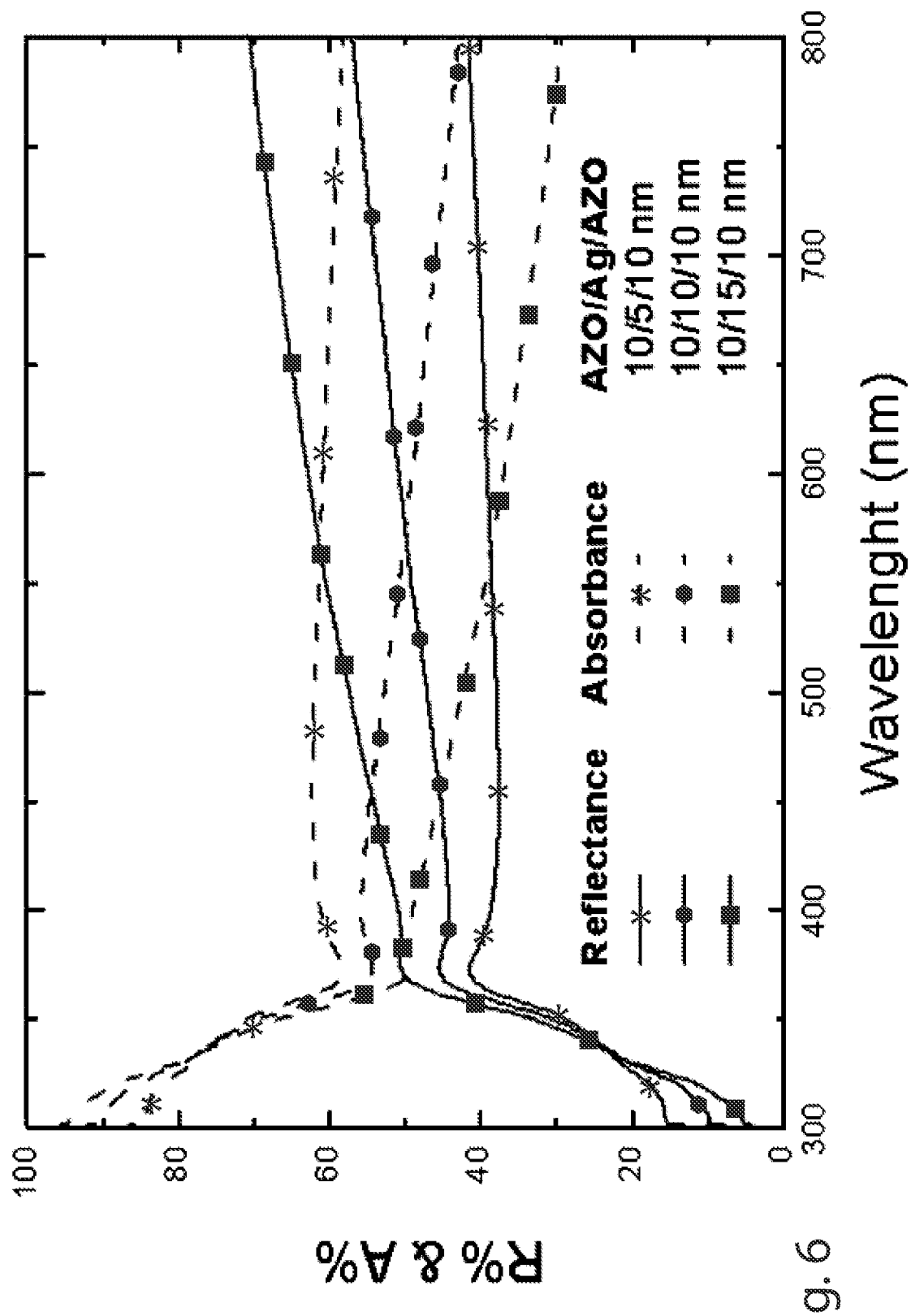
FIG. 6 shows the percentage of the reflectance and of the absorbance of three different conductive layers of a solar cell, which is not according to the present invention, as a function of an incident radiation wavelength.

In FIG. 6 the behavior of three different conductive layers 2 is shown, in terms of reflectance and absorbance as a function of an incident radiation wavelength, wherein each of the three conductive layers 2 comprises a transparent intermediate metal layer 23 made of Ag and the two oxide layers 21, 22 made of AZO. Specifically, the layers 21, 23, 22 of a first AZO/Ag/AZO conductive layer 2 have thicknesses respectively equal to 10 nm/5 nm/10 nm; the layers 21, 23, 22 of a second AZO/Ag/AZO conductive layer 2 have thicknesses respectively equal to 10 nm/10 nm/10 nm; and the layers 21, 23, 22 of a third AZO/Ag/AZO conductive layer 2 have thicknesses respectively equal to 10 nm/15 nm/10 nm.

It is evident that for each conductive layer 2, there is a local maximum in reflectance approximately at 375 nm (and consequently a local minimum in absorbance), and an increasing monotonic behavior for greater wavelengths, similarly to the behavior of the monolithic AZO layer shown in FIG. 6.

Such behavior in a solar cell is generally associated with poor performances. In fact, a higher reflectance means that less radiation passes through the conductive layer 2 and reaches the silicon layer 3, which in turn lowers the release of charge carriers by the photoelectric effect.

It is therefore desirable to have low reflectance for wavelengths comprised between 500 nm and 700 nm. Furthermore, it is desirable that the percentage of reflectance associated to wavelengths greater than 800 nm is between 30% and 40%, and that it increases with a relatively small slope.

FIGS. 7-10 show the percentage of reflectance as a function of the wavelength of an incident radiation for several solar cells 1 comprising a first layer 3 made of silicon and a conductive layer 2 overlapping said first layer 3, wherein each conductive layer 2 comprises a transparent intermediate metal layer 23 made of Ag and the two oxide layers 21, 22 made of AZO, having different thicknesses.

Figure 7:
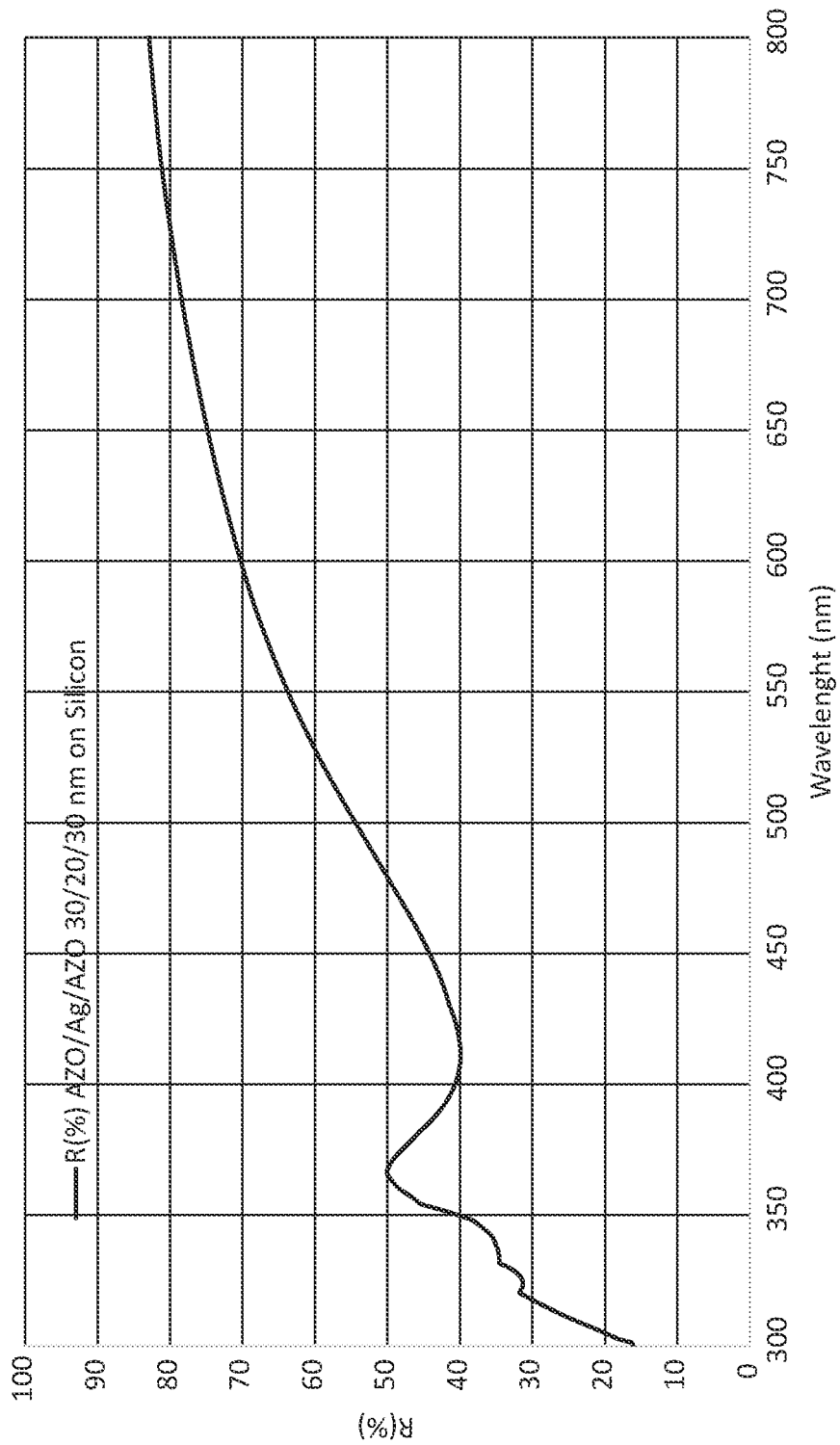
FIG. 7 shows the percentage of the reflectance of a first example of a solar cell, which is not according to the present invention.
Figure 8:
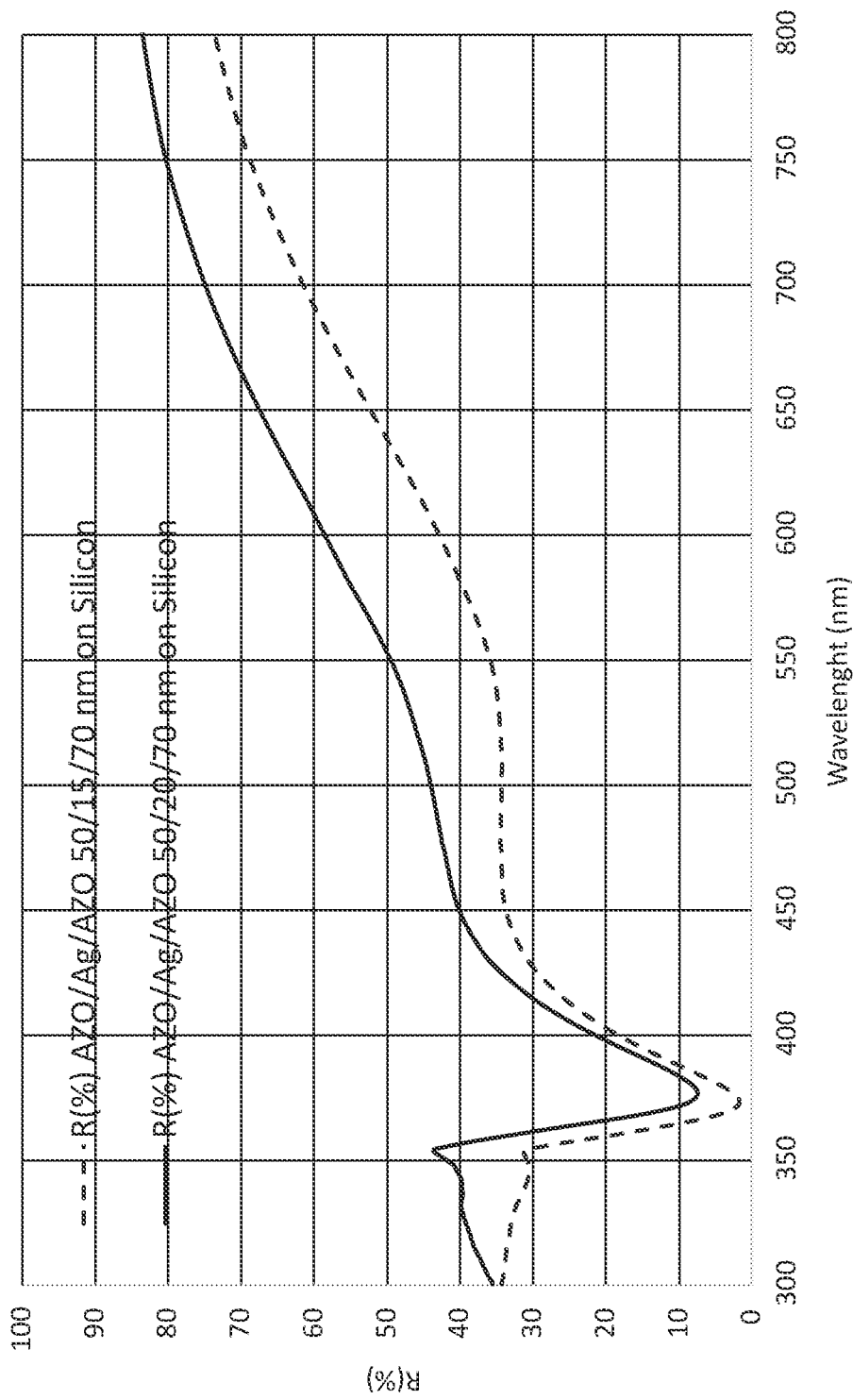
FIG. 8 shows the percentage of the reflectance of a second and of a third example of a solar cell, which is not according to the present invention.
Figure 9:
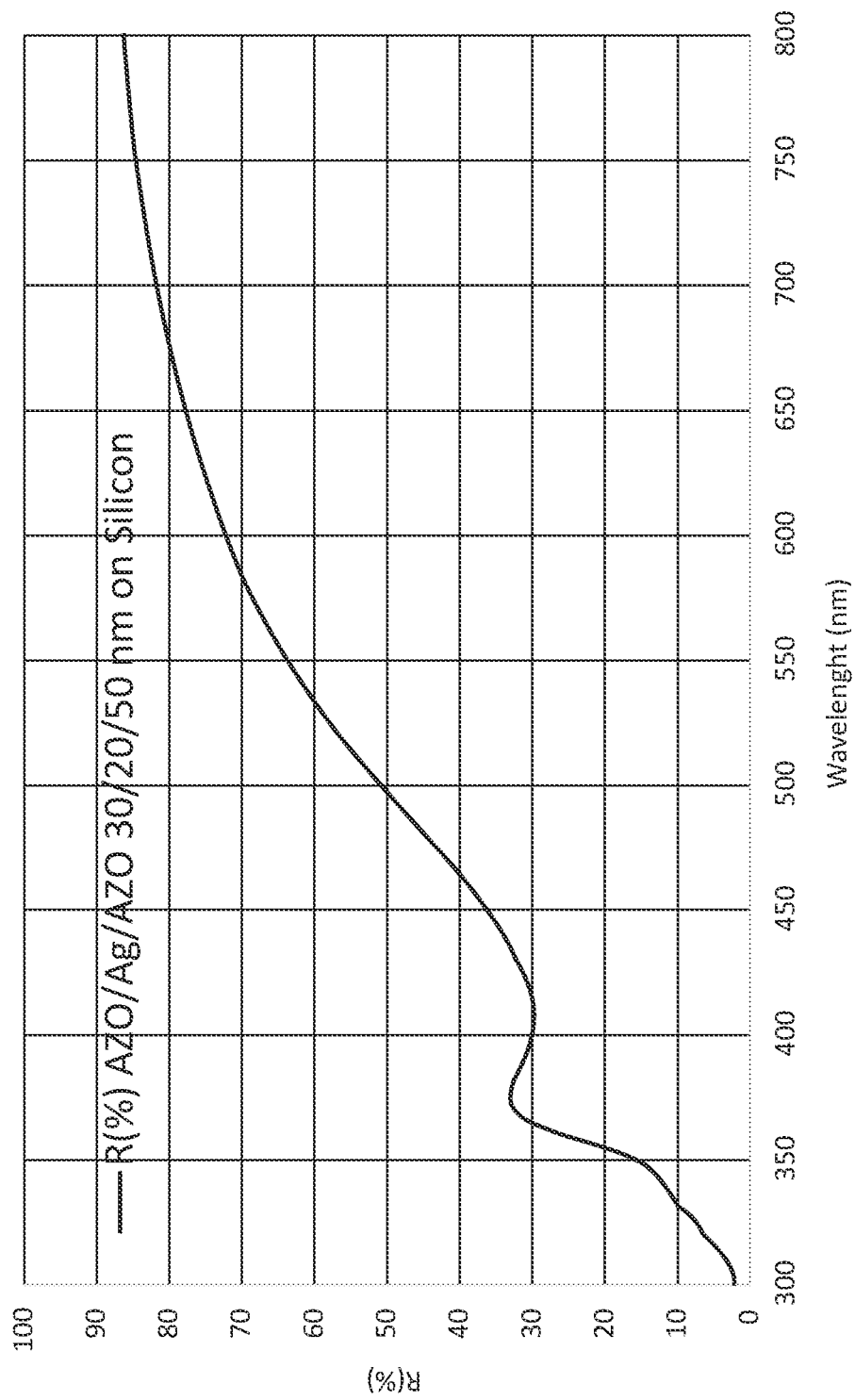
FIG. 9 shows the percentage of the reflectance of a fourth example of a solar cell, which is not according to the present invention.

Specifically, in a first solar cell 1, the reflectance thereof is shown in FIG. 7, the thicknesses of the layers 21, 23, 22 of the AZO/Ag/AZO conductive layer 2 are respectively 30 nm, 20 nm, and 30 nm;

in a second solar cell 1, the reflectance thereof is shown in FIG. 8, the thicknesses of the layers 21, 23, 22 of the AZO/Ag/AZO conductive layer 2 are respectively 50 nm, 15 nm, and 70 nm;

in a third solar cell 1, the reflectance thereof is also shown in FIG. 8, the thicknesses of the layers 21, 23, 22 of the AZO/Ag/AZO conductive layer 2 are respectively 50 nm, 20 nm, and 70 nm;

in a fourth solar cell 1, the reflectance thereof is shown in FIG. 9, the thicknesses of the layers 21, 23, 22 of the AZO/Ag/AZO conductive layer 2 are respectively 30 nm, 20 nm, and 50 nm;

in a fifth solar cell 1, the reflectance thereof is shown in FIG. 10, the thicknesses of the layers 21, 23, 22 of the AZO/Ag/AZO conductive layer 2 are respectively 50 nm, 5 nm, and 50 nm; and in a sixth solar cell 1, the reflectance thereof is also shown in FIG. 10, the thicknesses of the layers 21, 23, 22 of the AZO/Ag/AZO conductive layer 2 are respectively 50 nm, 10 nm, and 50 nm.

It is evident that the reflectance of the solar cells 1 shown in FIGS. 7-9, which is dependent on the respective thicknesses of the AZO/Ag/AZO conductive layers 2, has a non-desirable and non-particularly efficient behavior.

Surprisingly, the reflectance of the solar cells 1 shown in FIG. 10 has a local minimum for incident radiations having a wavelength between 500 nm and 700 nm, i.e. a desirable behavior in terms of reflectance, and therefore a greater efficiency, was achieved in these solar cells 1. In this way, it is possible to significantly increase the incident radiation at the silicon first layer 3.

The present invention has been described for illustrative but not limitative purposes, according to its preferred embodiment, but it is to be understood that variations and/or modifications can be made by those skilled in the art without departing from the scope of the claims, as defined by the annexed claims.

The invention claimed is:

1. A solar cell, comprising: at least a first layer made of a semiconductor material for absorbing photons from light radiation and releasing charge carriers, and at least one conductive layer, deposited directly onto said first layer, adapted to allow said light radiation to enter into said solar cell towards said first layer and to collect the charge carriers released by said first layer, said conductive layer consisting of three overlapped layers:

a transparent intermediate metal layer, made of metal, and two oxide layers, made of a transparent conductive oxide, wherein both said oxide layers consisting of aluminum doped zinc oxide, wherein said two oxide layers are respectively an inner oxide layer and an outer oxide layer surrounding said transparent intermediate metal layer so as to provide a low resistance path for the electrical charges and to maximize the amount of light radiation entering the solar cell, wherein the solar cell is a heterojunction bifacial solar cell comprising a front side and a rear side, said at least one first layer comprising a first layer made of crystalline silicon, a second layer and a third layer, said second and third layers being made of hydrogenated amorphous silicon, and overlapping said first layer, surrounding it, said second layer arranged in correspondence of said front side, said third layer arranged in correspondence of said rear side, said solar cell further comprising a fourth layer made of n-type doped hydrogenated amorphous silicon, overlapping said second layer, a fifth layer made of p-type doped hydrogenated amorphous silicon, overlapping said third layer, and two conductive layers of said at least one conductive layer, respectively overlapping said fourth layer and said fifth layer, wherein said outer oxide layer of said at least one conductive layer is an outermost layer of the solar cell;

wherein said transparent intermediate metal layer has a thickness between 5 nm and 7 nm, said inner oxide layer has a thickness of 50 nm; and said outer oxide layer has a thickness between 50 nm and 60 nm.

2. The solar cell according to claim 1, wherein said transparent intermediate metal layer has a thickness of 5 nm, said inner oxide layer has a thickness of 50 nm and said outer oxide layer has a thickness of 50 nm.

3. The solar cell according to claim 1, wherein said transparent intermediate metal layer has the shape of a continuous layer.

4. The solar cell according to claim 1, wherein said transparent intermediate metal layer is arranged as a mesh network.

5. The solar cell according to claim 1, wherein the solar cell does not comprise a metallization grid or in that it comprises a metallization grid made only by parallel or substantially parallel conductors.

6. A solar cells module, comprising:

a first solar cell and a second solar cell according to claim 1, and connectors for electrically connecting a conductive layer of said first solar cell to a conductive layer of said second solar cell, said connectors directly attached to said outer oxide layer of said conductive layer of said first solar cell and to said outer oxide layer of said conductive layer of said second solar cell; or to said parallel or substantially parallel conductors on said conductive layer of said first solar cell and/or on said conductive layer of said second solar cell.

7. The solar cell according to claim 1, wherein the said two conductive layers are made by depositing their inner oxide layers respectively over said fourth layer and said fifth layer.

* * * * *